(12) United States Patent
Chen

(10) Patent No.: US 8,665,658 B2
(45) Date of Patent: Mar. 4, 2014

(54) TRACKING CELL AND METHOD FOR SEMICONDUCTOR MEMORIES

(75) Inventor: Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 111 days.

(21) Appl. No.: 13/313,092

(22) Filed: Dec. 7, 2011

(65) Prior Publication Data

US 2013/0148438 A1 Jun. 13, 2013

(51) Int. Cl.
*G11C 7/10* (2006.01)
*G11C 7/00* (2006.01)

(52) U.S. Cl.
USPC .............. 365/189.2; 365/191; 365/189.14

(58) Field of Classification Search
None
See application file for complete search history.

(56) References Cited

U.S. PATENT DOCUMENTS

2011/0235444 A1* 9/2011 Chuang et al. ............ 365/189.16

OTHER PUBLICATIONS

Nii,K. et al., "A 45-nm Single-port and Dual-port SRAM family with Robust Read/Write Stabilizing Circuitry under DVFS Environment", 2008 Symposium on VLSI Circuits, Digest of Technical Papers, pp. 212-213.

* cited by examiner

*Primary Examiner* — Huan Hoang
*Assistant Examiner* — James G Norman
(74) *Attorney, Agent, or Firm* — Duane Morris LLP

(57) ABSTRACT

A semiconductor memory includes a memory array having at least one bit line, a tracking bit line, and a global tracking circuit. The tracking bit line is configured to emulate a voltage transition of the at least one bit line. The global tracking circuit is configured to generate a timing signal for generating a negative voltage with respect to ground on the at least one bit line of the memory array.

24 Claims, 5 Drawing Sheets

US 8,665,658 B2

TRACKING CELL AND METHOD FOR SEMICONDUCTOR MEMORIES

FIELD OF DISCLOSURE

The disclosed system and method relate to semiconductor memories. More specifically, the disclosed system and method relate to an improved tracking scheme for semiconductor memories.

BACKGROUND

Semiconductor memories, such as read only memories ("ROMs"), random access memories ("RAMs"), flash memories, and the like, are incorporated in a wide array of portable electronic devices including mobile phones, tablet computers, laptop computers, and personal music players, e.g., iPods. The operation of such semiconductor memories is dependent on timing signals, which are used to control the reading data from and writing data to memory bit cells.

As designers continue to try extend the battery life of portable electronic devices, the operating voltages of the semiconductor memories are reduced. The reduction of the operating voltage can cause issues with reliably writing data to and reading data from the semiconductor memory due to a smaller voltage swing. Consequently, some semiconductor memory designs utilize negative voltages during writing operations as a way to increase the voltage swing of the memory bit cell so that data may be reliably written. Conventional semiconductor memories rely on local timing circuits to provide the negative voltages at a precise time during a write operation. However, such conventional semiconductor memories suffer from significant area penalties from including the timing circuitry for providing negative voltages to the bit lines.

DETAILED DESCRIPTION

Figure 1:
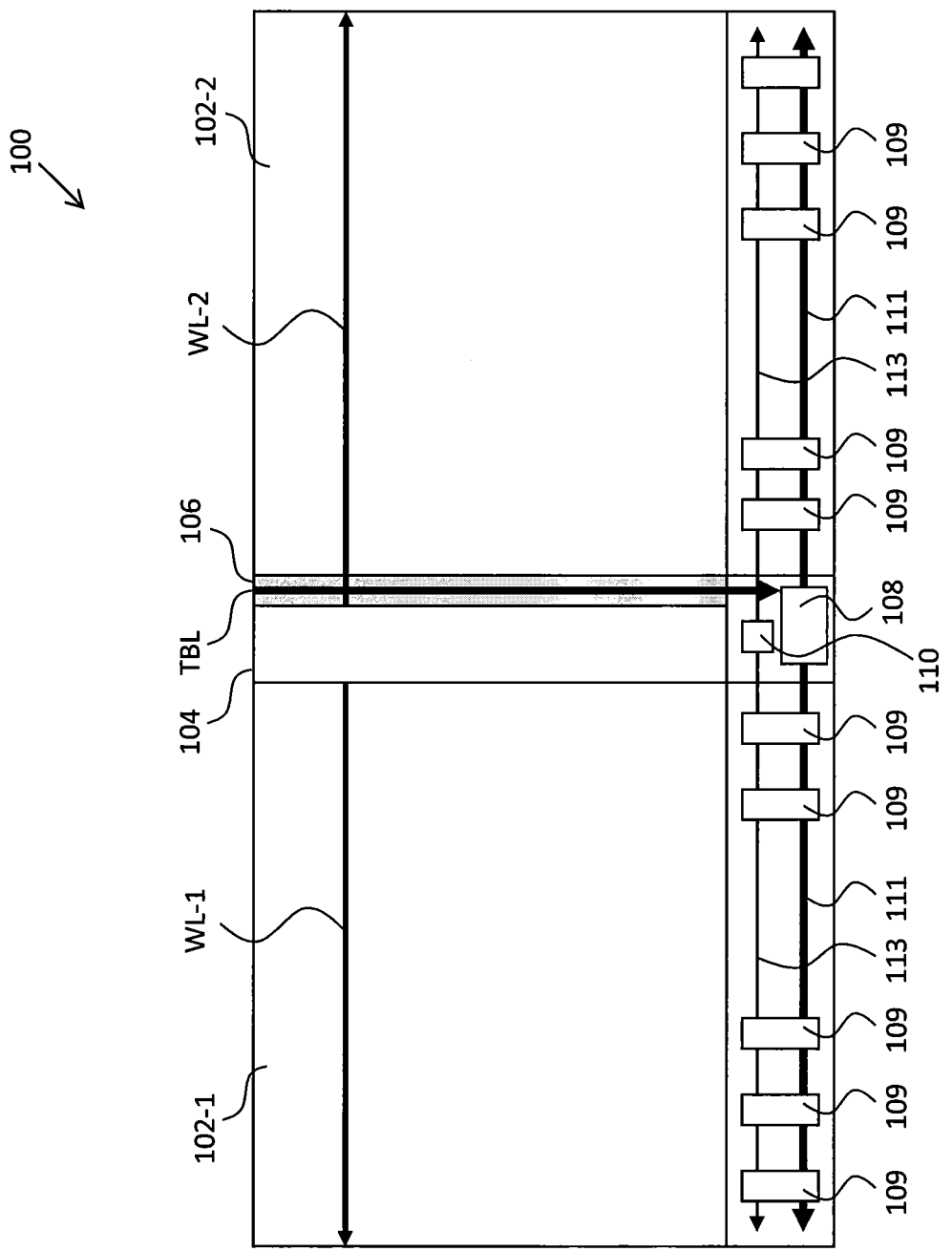
FIG. 1 is a plan view of one example of an improved semiconductor memory configured with a global read/write tracking circuit coupled to a replica tracking column and a plurality of read/write circuits.
Figure 2:
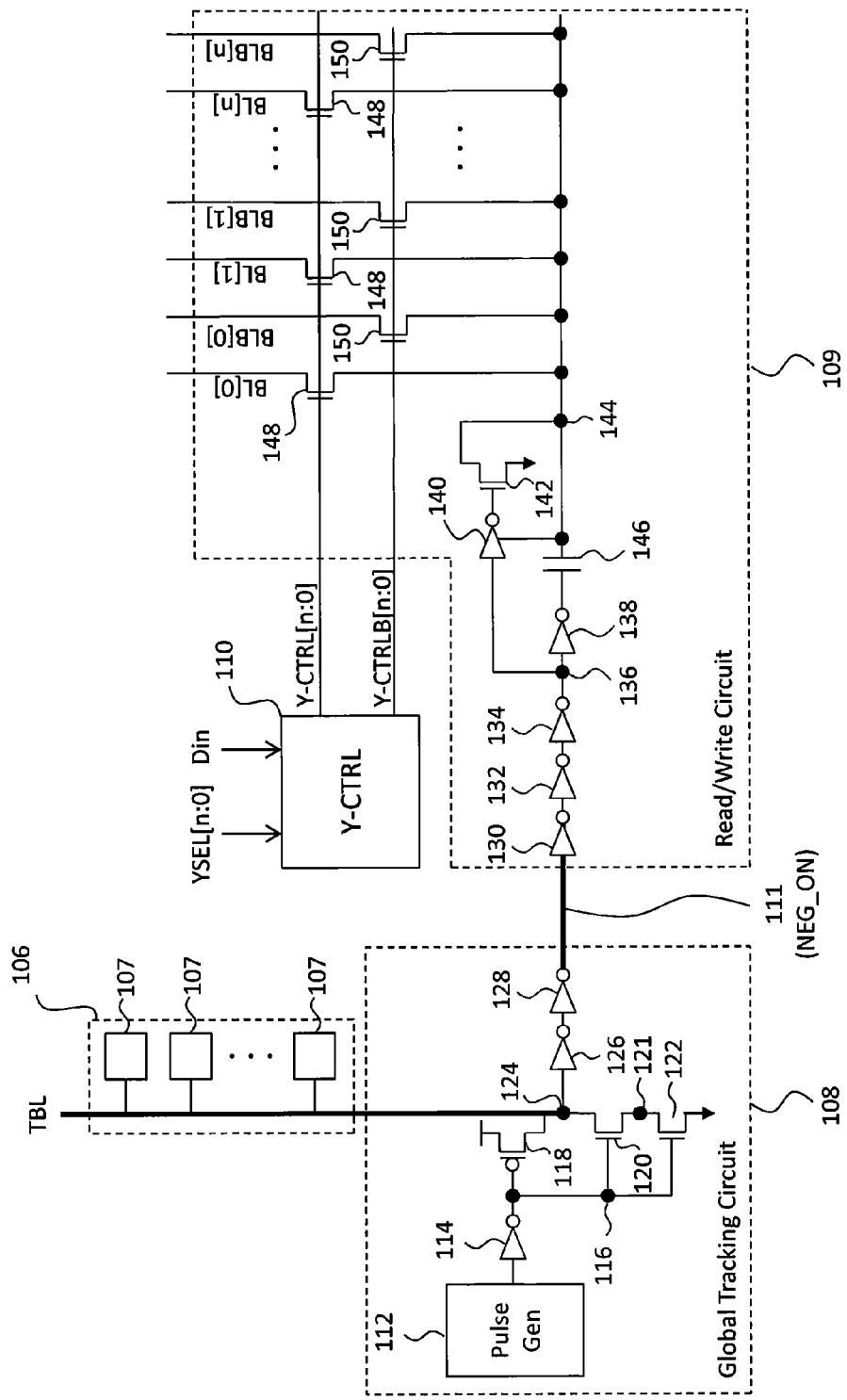
FIG. 2 is a circuit diagram of one example of a global read/write tracking circuit and a read/write circuit in accordance with the improved semiconductor memory illustrated in FIG. 1.

FIG. 1 illustrates one example of an improved semiconductor memory 100. In some embodiments, semiconductor memory 100 is a random access memory ("RAM") such as a static RAM ("SRAM") or a dynamic RAM ("DRAM"), although one skilled in the art will understand that the semiconductor memory 100 may be adapted as a read only memory ("ROM"). Memory 100 includes one or more arrays 102-1, 102-2 (collectively referred to as "arrays 102") of memory bit cells (not shown) arranged in rows and columns. Arrays 102 are separated by a word line ("WL") decoder 104 and a replicated column 106 including a tracking bit line, TBL, extending parallel to WL decoder 104 and a plurality of tracking bit cells 107 (FIG. 2). TBL is configured to track (e.g., emulate) the transition of the bit lines (FIG. 2) of semiconductor array 100. Word lines WL-1 and WL-2 are coupled to WL decoder 104 extending in substantially perpendicular directions, e.g., in an x-direction, with respect to the direction in which TBL and the bit lines, BL and BLB (FIGS. 1 and 2), extend, e.g., in a y-direction.

TBL is coupled to a global read/write tracking circuit (sometimes referred to as "global tracking circuit") 108 that is configured to generate a negative bit line firing timing signal, NEG_ON, based on the voltage of the TBL. Since the TBL is attached on the edge of the SRAM bit cell array, it has the same BL length as the non-tracking, i.e., regular, BL in the memory array. The NEG_ON signal is provided to one or more read/write control circuits 109, which are configured to pull a bit line from a first voltage to a second voltage in response to the NEG_ON signal. In some embodiments, the first voltage is set at or near ground and the second voltage is a negative voltage with respect to ground. A y-control circuit 110 is configured to generate control signals, Y-CTRL and Y-CTRLB, for selecting memory bit cells in the y-direction.

Global read/write tracking circuit 108 is also connected to one or more read/write control circuits 109. The negative bit line firing signals, NEG ON, are provided from global read/write tracking circuit 108 via one or more lines 111 that extend in an x-direction to read/write control circuits 109. Y-control circuit 110 provides control signals Y-CTRL and Y-CTRLB to read/write control circuits 109 via one or more lines 113.

FIG. 2 illustrates one example of global read/write tracking circuit 108 coupled to a read/write control circuit 109, which is also coupled to Y-control ("Y-CTRL") circuit 110. As shown in FIG. 2, global read/write tracking circuit 108 includes a pulse generation circuit 112 having an output coupled to an input of inverter 114 and configured to generate a first signal. The output of inverter 114 is coupled to node 116 for providing a second signal based on the first signal to the gates of transistors 118, 120, and 122. Transistor 118, which may be a PMOS transistor, has its source coupled to a high-voltage supply line or node having a voltage equal to the operating voltage, e.g., VDD, and its drain coupled to node 124.

Transistor 120, which may be an NMOS transistor configured to operate as a replica write multiplexer ("mux"), has its source coupled to node 121 and its drain coupled to node 124. Replica write mux is configured to replicate the timing of a write multiplexer (not shown) of semiconductor array 100, which is used to select one or more memory bit cells to which data is to be written. As will be understood by one skilled in the art, other circuits or circuit elements may be implemented as replica write mux 120.

The source of transistor 122, which may also be an NMOS transistor configured to operate as a replica write driver, has its source coupled to a low-voltage supply line or node set at ground or VSS. Replica write driver is configured to replicate the timing of a write driver circuit (not shown) of semiconductor array 100 that is used to drive one or more bit lines to a desired voltage (e.g., a logic one or logic zero) that is to be written to a memory bit cell. The drain of transistor 122 is coupled to node 121. Node 124 is coupled to the TBL and to the input of inverter 126. In some embodiment, node 124 is coupled to the input of inverter 126, but is not disposed between the drain of transistor 118 and the drain of transistor 120. For example, node 124 may be coupled to the input of 126 and to TBL at the far end of tracking column 106. The output of inverter 126 is coupled to the input of inverter 128, which outputs negative firing timing signal NEG_ON to read/write control circuit 109. In some embodiments, inverters 126 and 128 may be eliminated such that the NEG ON signal is provided by the TBL.

Read/write control circuit 109 includes first, second, and third inverters 130, 132, and 134, which are coupled together in series. The first inverter 130 receives the NEG_ON signal at its input and outputs an inversion of the NEG_ON signal to inverter 132. Inverter 132 has its input coupled to the output of inverter 130 and its output coupled to the input of inverter 134 having its output coupled to node 136. In some embodiments, inverters 130, 132, and 134 may be implemented as a single inverter having its output coupled to node 136. Node 136 is coupled to the inputs of inverter 138 and inverter 140. Inverter 140 functions as a write driver with its output coupled to the gate of transistor 142. Transistor may be an NMOS transistor with its source coupled to ground or a low voltage source node, e.g., VSS, and its drain coupled to node 144. Node 144 is coupled to capacitor 146, which is coupled to the output of inverter 138, and to inverter 140.

A number, n, of complementary bit line pairs, BL[n:0] and BLB[n:0], are coupled to node 144 through transistors 148 and 150. For example, each of the BLs is coupled to node 144 through a respective transistor 148, and each of the BLBs is coupled to node 144 through a respective transistor 150. Each of the transistors 148 has its source coupled to node 144, its drain coupled to a respective BL, and its gate coupled to receive a respective control signal, e.g., Y-CTRL[n:0], that controls the coupling of the respective bit line to node 144. Each of the transistors 150 has its source coupled to node 144, its drain coupled to a respective BLB, and its gate coupled to receive a respective control signal, e.g., YCTRLB[n:0], that controls the coupling of the respective BLB to node 144.

Y-CTRL circuit 110 receives a y-selection signals, YSEL [n:0], and an input signal, Din, and outputs control signals Y-CTRL[n:0] and Y-CTRLB[n:0] in response. For example, if Y-CTRL circuit 110 receives signals YSEL[0]=1 and Din=1 as inputs, then Y-CTRL circuit 110 turns transistors 150 on to pass the voltage at node 144 to the bit line BLB[0]. If the y-selection signal YSEL[0] is high, i.e., YSEL[0]=1, and signal Din is low, i.e., Din=0, then transistor 150 coupled to BL[0] is turned on to couple the voltage at node 144 to BL[0]. In this manner, Y-CTRL circuit 110 controls the turning on and off of transistors 148 and 150.

Figure 3:
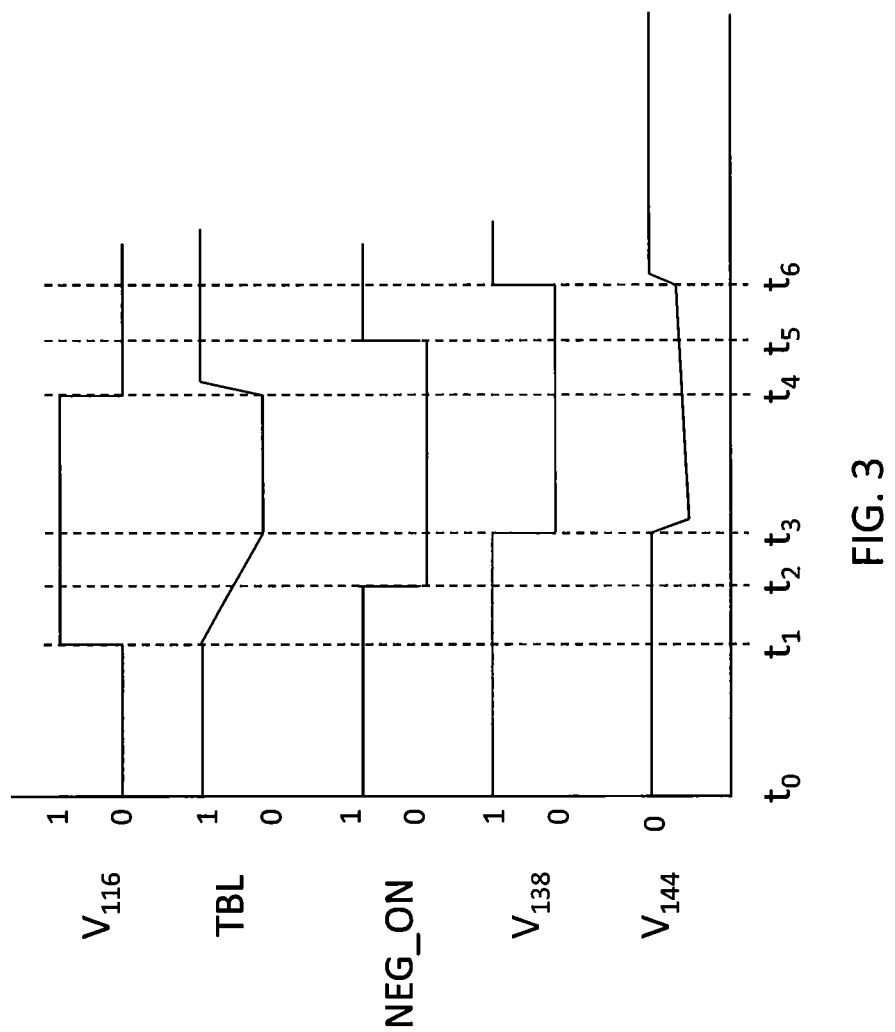
FIG. 3 is a timing diagram of various signals of the global read/write tracking circuit and a read/write circuit in accordance with FIG. 2.

The global read/write tracking circuit 108 and read/write circuits 109 advantageously generate a negative bit line signal, NEG ON, that ensures a negative bias voltage is provided to a bit line, e.g., BL and BLB, which improves the write operation as illustrated in FIGS. 3. At time $t_0$, the voltage at node 116, $V_{116}$, is a logic zero as pulse generator 112 outputs a logic one to inverter 114. With $V_{116}$ at a logic zero voltage level, transistor 118 is in a current-conducting 'on' state such that high-voltage supply line is coupled to node 124 resulting in TBL being a logic one. Transistors 120 and 122 are in non-current-conducting 'off' state when $V_{116}$ is a logic zero such that ground or the low-voltage power supply rail is not coupled to TBL.

The voltage of TBL is inverted by inverter 126 and then inverted again by inverter 128 such that signal NEG_ON, which is output from global read/write tracking circuit 108, is also a logic one. The logic one NEG_ON signal is received at the input of inverter 130 and is repeated inverted by inverters 130, 132, and 134 such that a logic zero is output at node 136. The logic zero at node 136 is inverted by inverter 138, which provides a logic one as its output voltage, $V_{138}$. The logic zero at node 136 is also provided to the input of inverter 140, which outputs a logic one to the gate of transistor 142. The logic one at the gate of transistor 142 turns transistor 142 on such that ground or the voltage of the low voltage power supply is coupled to node 144.

At time $t_1$, $V_{116}$ transitions from a logic zero to a logic one. With $V_{116}$ at a logic one, transistor 118 is turned off such that the high-voltage supply is decoupled from TBL and transistors 120 and 122 are turned on such that the low-voltage supply is coupled to TBL resulting in TBL being pulled low.

TBL transitioning from a logic one to logic zero results in inverter 126 outputting a logic one and inverter 128, which outputs signal NEG ON, outputting a logic zero at time $t_2$. Inverters 126 and 128 provide the delay between times $t_1$ and $t_2$ as will be understood by one skilled in the art. The NEG_ON signal passes through inverters 130, 132, and 134 such that a logic one is output to node 136. The logic one at the input of inverter 138 results in $V_{138}$ being a logic zero. The logic one at node 136 is also provided to the input of inverter 140, which outputs a logic zero to the gate of transistor 142. The logic zero at the gate of transistor 142 turns transistor 142 off.

As $V_{138}$ transitions to a logic zero, capacitor 146 discharges to create a negative voltage at node 144 at time $t_3$. The time at which $V_{144}$ is negative may coincide with the turning on of one or more of transistors 148, 150 to couple a negative voltage to bit lines BL and/or BLB. The complementary bit lines BL and BLB are coupled to node 144 when signals Y-CTRL[n:0] and Y-CTRLB[n:0] are in a logic one state, which turns transistors 148 and/or 150 on. The negative voltage level on bit lines BL and/or BLB improves the writing speed of the semiconductor memory.

At time $t_4$, $V_{116}$ transitions from a logic one back to a logic zero in response to pulse generator 112 outputting a logic one to inverter 114. As described above, the logic zero at node 116 turns transistor 118 on such that high-voltage supply line is coupled to TBL and turns off transistors 120 and 122, such that low-voltage supply line is disconnected from TBL. TBL transitions from a logic zero to a logic one, in response to being coupled to the high-voltage supply line through PMOS transistor 118.

The voltage of TBL is inverted by inverter 126, and inverter 128 inverts the voltage output from inverter 126. At time $t_5$, inverter 128 outputs a logic one as the signal NEG_ON. The delay between times $t_4$ and $t_5$ is attributed to inverters 126 and 128 as will be understood by one skilled in the art. The NEG_ON signal is received at the input of inverter 130, which provides an inverted voltage level, e.g., a logic zero, to inverter 132. Inverter 132 outputs a logic one to inverter 134 in response to receiving the logic zero from inverter 130. Inverter 134 outputs a logic zero to node 136 in response to receiving the logic one from inverter 132.

At time $t_6$, the output of inverter 138, $V_{138}$, is a logic one in response to the voltage at node 136 being a logic zero. The output of inverter 140 is also a logic one in response to node 136 being at a logic zero voltage level. The logic one at the gate of transistor 142 turns transistor 142 into an on state such that ground or a low voltage supply rail is coupled to node 144.

Figure 4:
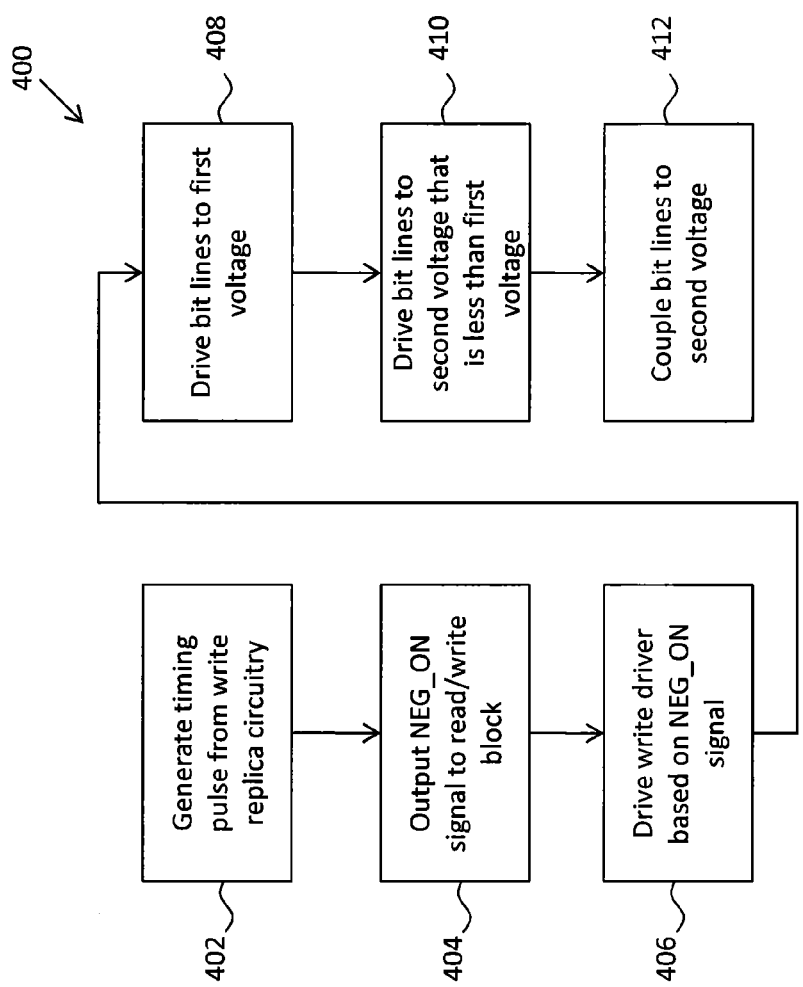
FIG. 4 is a flow diagram of one example of a method of providing a write assist to a semiconductor memory.

The operation of semiconductor memory 100 is described with reference to FIG. 4. At block 402, a pulse is generated by pulse generator 112 of global read/write tracking circuit 108. The pulse is provided to inverter 114, which has its output coupled to node 116.

At block 404, the NEG_ON signal is generated by global read/write tracking circuit 108. The NEG_ON signal is generated in response to the pulse generated by pulse generator 112. For example, if pulse generator 112 outputs a logic one, then a logic zero is received at node 116 to turn on transistor 118 and turn off transistors 120 and 122. When transistor 118 is on, it couples the TBL to high-voltage source. When transistors 120 and 122 are off, they disconnect the TBL from ground or the low-voltage source. If pulse generator 112 outputs a logic zero, then a logic one is received at node 116. Transistor 118 turns off in response to receiving a logic one at its gate, and transistors 120 and 122 are turned on to couple the TBL to ground or a low-voltage source.

The voltage of the TBL, which may be equal to the NEG_ON signal, is output from global read/write tracking circuit 108 to read/write block 109. In some embodiments, the TBL may be directly coupled to the read/write block 109. In some embodiments, the TBL may be coupled to the read/write block 109 through inverters 126 and 128 as illustrated in FIG. 2.

At block 406, a voltage based on the NEG_ON signal is used to drive a write driver. For example and as best seen in FIG. 2, the NEG_ON signal received at read/write block 109 is passed through one or more inverters 130, 132, and 134 such that the voltage at node 136, $V_{136}$, is based on the NEG_ON signal. The voltage at node 136, $V_{136}$, is coupled to the input of inverter 140, which has its output coupled to write driving transistor 142.

At block 408, the write driver drives the bit lines BL and BLB to a first voltage. For example, if $V_{136}$ is a logic zero, then inverter 140 outputs a logic one to transistor 142 to turn transistor 142 on. With transistor 142 on, then the voltage of node 144, $V_{144}$, is driven to ground or to a low voltage supply by driving transistor 142.

At block 410, the bit lines BL and BLB are driven to a second voltage that is less than the first voltage. In some embodiments, bit lines BL and BLB are driven to a negative voltage with respect to ground based on the NEG_ON signal. For example, the voltage of node 136 is inverted by inverter 138, which has its output coupled to capacitor 146. When $V_{136}$ is a logic one, then inverter 138 outputs a logic zero to capacitor 146. At approximately the same time, transistor 140 outputs a logic zero to driving transistor 140, which turns off transistor 140. The stored voltage of capacitor 146 discharges resulting in a negative voltage at node 144.

At block 412, the bit lines BL and BLB are coupled to node 144. Node is coupled to the bit lines BL and BLB through transistors 148 and 150, which are selectively opened and closed in response to signals Y-CTRL[n:0] and Y-CTRLB[n:0]. As described above, Y-CTRL signal 110 outputs control signals Y-CTRL[n:0] and Y-CTRLB[n:0] in response to signals YSEL[n:0] and Din. The negative bias voltage on the bit lines BL and BLB provides a write assist to the semiconductor memory as the negative voltage improves the write speed when writing a zero or a one to a memory bit cell. The global read/write tracking circuit 108 advantageously generates the NEG_ON signal while having a smaller area penalty compared to implementing local circuits for generating negative firing signals.

Figure 5:
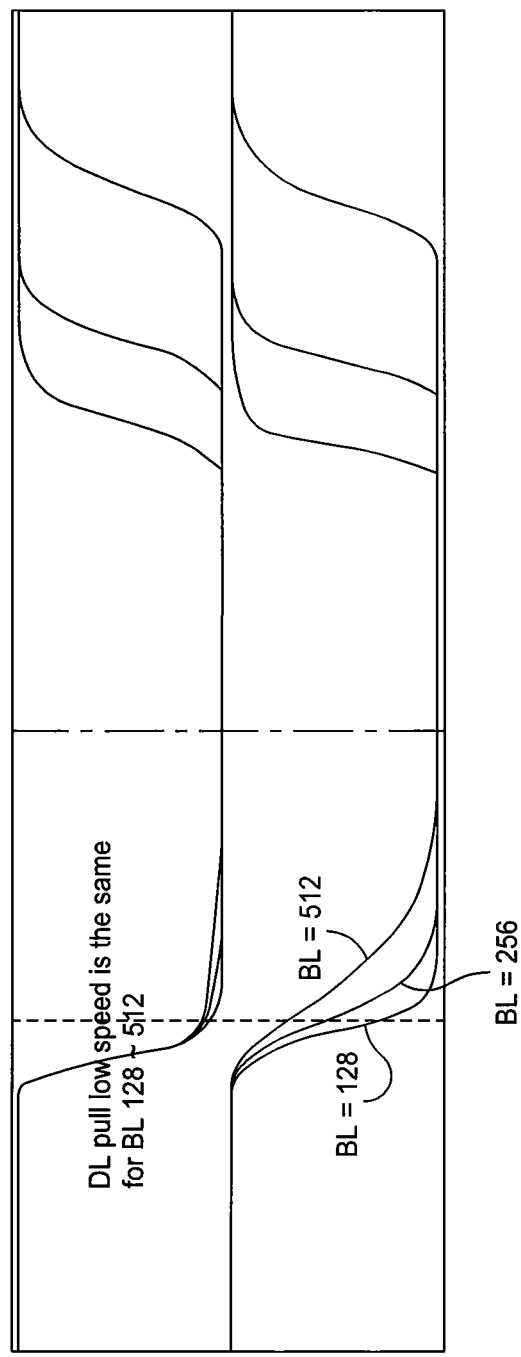
FIG. 5 is a simulation of various signals of the global read/write tracking circuit and a read/write circuit in accordance with FIG. 2.

FIG. 5 illustrates the pulling low speed of node 121, which serves as the data line, DL, the TBL, and the bit line BL. As shown in FIG. 5, the DL is pulled low at approximately the same time as the BL, and the TBL is pulled low slightly before the BL. The slew rate of node 121 is almost identical regardless of the BL length as shown in the upper portion of FIG. 5. As shown in the bottom half of FIG. 5, the voltage at node 124 varies based on the BL length as the longer the BL length, e.g., when BL=512, the slower the pull-low slew rate. Consequently, the improved semiconductor memory 100 described herein advantageously uses the voltage at node 124 to generate the NEG_ON signal to generate the negative voltage at a more appropriate time resulting in write improvement.

In some embodiments, a semiconductor memory includes a memory array having at least one bit line, a tracking bit line, and a global tracking circuit. The tracking bit line is configured to emulate a voltage transition of the at least one bit line. The global tracking circuit is configured to generate a timing signal for generating a negative voltage with respect to ground on the at least one bit line of the memory array.

In some embodiments, a method includes outputting a first timing signal from a global tracking circuit coupled to a tracking bit line of a semiconductor memory, providing a first voltage level to at least one bit line of the semiconductor memory based on the first signal, and providing a second voltage level to the at least one bit line of the semiconductor memory based on the first signal. The first timing signal is based on a voltage of the tracking bit line, and the second voltage level is lower than the first voltage level with respect to ground.

In some embodiments, a semiconductor memory includes a memory array, a tracking bit line, a global tracking circuit, and a read and write control circuit. The tracking bit line is configured to emulate a voltage transition of the at least one bit line. The global tracking circuit is coupled to the tracking bit line and is configured to generate a timing signal for generating a negative voltage with respect to ground on at least one bit line of the memory array. The read and write control circuit is coupled to the global tracking circuit and is configured to generate the negative voltage on the at least one bit line of the memory array in response to receiving the timing signal.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A semiconductor memory, comprising:
a memory array having at least one bit line;
a tracking bit line configured to emulate a voltage transition of the at least one bit line; and
a global tracking circuit coupled to the tracking bit line and configured to generate a timing signal for generating a negative voltage with respect to ground on the at least one bit line of the memory array, the global tracking circuit including
a pulse generator configured to generate a first signal;
a replica write multiplexer coupled to the tracking bit line;
a replica write driver coupled to the replica multiplexer and to a first voltage supply; and
a first transistor coupled to the tracking bit line and to a second voltage supply,
wherein the replica write multiplexer and replica write driver are configured to selectively couple the tracking bit line to the first voltage supply in response to the first signal, and the first transistor is configured to selectively couple the tracking bit line to the second voltage supply based on the first signal.

2. The semiconductor memory of claim 1, wherein the global tracking circuit includes at least one inverter having an input coupled to the tracking bit line and an output configured to provide the timing signal for generating the negative voltage to a read and write control circuit coupled to the memory array.

3. The semiconductor memory of claim 1, wherein the replica write multiplexer includes a second transistor having a gate configured to receive the first signal, a drain coupled to the tracking bit line, and a source coupled to the replica write driver.

4. The semiconductor memory of claim 1, wherein the replica write driver includes a second transistor having a gate configured to receive the first signal, a drain coupled to the replica write multiplexer, and a source coupled to the first voltage supply.

5. The semiconductor memory of claim 1, further comprising a read and write control circuit coupled to the global tracking circuit and configured to generate the negative voltage on the at least one bit line of the memory array.

6. The semiconductor memory of claim 5, wherein the read and write control circuit includes:
   a first inverter having an input coupled to a first node;
   a first transistor having a gate coupled to an output of the first inverter, a source coupled to a first voltage supply, and a drain coupled to a second node that is coupled to the at least one bit line of the memory array; and
   a second inverter having an input coupled to the first node and an output coupled to a capacitor that is coupled to the second node,
   wherein the first transistor is configured to selectively couple the second node to the first voltage supply in response to a signal based on the timing signal being received at the first node, and the capacitor is configured to generate the negative voltage with respect to ground in response to the signal based on the timing signal being received at the first node.

7. The semiconductor memory of claim 6, wherein the read and write control circuit includes a plurality of serially connected inverters configured to receive the timing signal for generating the negative voltage and output the first signal to the first inverter.

8. The semiconductor memory of claim 6, wherein the first voltage supply has a voltage approximately equal to ground.

9. A method, comprising:
   generating a first timing signal at a pulse generator of a global tracking circuit that is coupled to a tracking bit line of a semiconductor memory;
   selectively coupling the tracking bit line to one of a first voltage supply in response to receiving the first timing signal at a replica write multiplexer and a replica write driver of the global tracking circuit or to a second voltage supply in response to receiving the first timing signal at a first transistor of the global tracking circuit;
   outputting a second timing signal from the global tracking circuit, the second timing signal based on a voltage of the tracking bit line;
   providing a first voltage level to at least one bit line of the semiconductor memory based on the second timing signal; and
   providing a second voltage level to the at least one bit line of the semiconductor memory based on the second timing signal,
   wherein the second voltage level is lower than the first voltage level with respect to ground.

10. The method of claim 9, wherein the second voltage level is lower than ground.

11. The method of claim 9, further comprising:
   inverting the first timing signal to provide an inverted first timing signal; and
   providing the inverted first timing signal to the replica write multiplexer, to the replica write driver, and to the first transistor.

12. The method of claim 9, wherein providing the first voltage level to at least one bit line of the semiconductor memory includes:
   coupling a first node to a first voltage supply set at the first voltage level based on the second timing signal; and
   coupling the at least one bit line to the first node through a second transistor in response to a control signal received at a gate of the second transistor.

13. The method of claim 9, wherein providing the second voltage level to at least one bit line of the semiconductor memory includes:
   discharging a capacitor coupled to a first node in response to the second timing signal; and
   coupling the at least one bit line to the first node through a second transistor in response to a control signal received at a gate of the second transistor.

14. A semiconductor memory, comprising:
   a memory array;
   a tracking bit line configured to emulate a voltage transition of the at least one bit line;
   a global tracking circuit coupled to the tracking bit line and configured to generate a timing signal for generating a negative voltage with respect to ground on at least one bit line of the memory array, the global tracking circuit including
      a pulse generator configured to generate a first signal;
      a replica write multiplexer coupled to the tracking bit line;
      a replica write driver coupled to the replica multiplexer and to a first voltage supply; and
      a first transistor coupled to the tracking bit line and to a second voltage supply; and
   a read and write control circuit coupled to the global tracking circuit and configured to generate the negative voltage on the at least one bit line of the memory array in response to receiving the timing signal,
   wherein the replica write multiplexer and replica write driver are configured to selectively couple the tracking bit line to the first voltage supply in response to the first signal, and the first transistor is configured to selectively couple the tracking bit line to the second voltage supply based on the first signal.

15. The semiconductor memory of claim 14, wherein the global tracking circuit includes at least one inverter having an input coupled to the tracking bit line and an output configured to provide the timing signal from generating the negative voltage to a read and write control circuit coupled to the memory array.

16. The semiconductor memory of claim 14, wherein the replica multiplexer includes a second transistor having a gate configured to receive the first signal, a drain coupled to the tracking bit line, and a source coupled to the replica write driver.

17. The semiconductor memory of claim 14, wherein the read and write control circuit includes:
   a first inverter having an input coupled to a first node;
   a first transistor having a gate coupled to an output of the first inverter, a source coupled to a first voltage supply, and a drain coupled to a second node that is coupled to the at least one bit line of the memory array; and
   a second inverter having an input coupled to the first node and an output coupled to a capacitor that is coupled to the second node,
   wherein the first transistor is configured to selectively couple the second node to the first voltage supply in response to a signal based on the timing signal being received at the first node, and the capacitor is configured to generate the negative voltage with respect to ground.

18. The semiconductor memory of claim 17, wherein the read and write control circuit includes a plurality of serially connected inverters configured to receive the timing signal for generating the negative voltage and output the first signal to the first inverter.

19. The semiconductor memory of claim 14, wherein the first voltage supply has a voltage approximately equal to ground.

20. A semiconductor memory, comprising:
a memory array having at least one bit line;
a tracking bit line configured to emulate a voltage transition of the at least one bit line;
a global tracking circuit coupled to the tracking bit line and configured to generate a timing signal for generating a negative voltage with respect to ground on the at least one bit line of the memory array;
a read and write control circuit coupled to the global tracking circuit and configured to generate the negative voltage on the at least one bit line of the memory array, the read and write control circuit including:
a first inverter having an input coupled to a first node,
a first transistor having a gate coupled to an output of the first inverter, a source coupled to a first voltage supply, and a drain coupled to a second node that is coupled to the at least one bit line of the memory array, and
a second inverter having an input coupled to the first node and an output coupled to a capacitor that is coupled to the second node,
wherein the first transistor is configured to selectively couple the second node to the first voltage supply in response to a signal based on the timing signal being received at the first node, and the capacitor is configured to generate the negative voltage with respect to ground in response to the signal based on the timing signal being received at the first node.

21. The semiconductor memory of claim 20, wherein the global tracking circuit includes:
a pulse generator configured to generate a first signal;
a replica write multiplexer coupled to the tracking bit line;
a replica write driver coupled to the replica multiplexer and to the first voltage supply; and
a second transistor coupled to the tracking bit line and to a second voltage supply,
wherein the replica write multiplexer and replica write driver are configured to selectively couple the tracking bit line to the first voltage supply in response to the first signal, and the first transistor is configured to selectively couple the tracking bit line to the second voltage supply based on the first signal.

22. The semiconductor memory of claim 21, wherein the global tracking circuit includes at least one inverter having an input coupled to the tracking bit line and an output configured to provide the timing signal from generating the negative voltage to a read and write control circuit coupled to the memory array.

23. The semiconductor memory of claim 21, wherein the replica multiplexer includes a third transistor having a gate configured to receive the first signal, a drain coupled to the tracking bit line, and a source coupled to the replica write driver.

24. The semiconductor memory of claim 20, wherein the read and write control circuit includes a plurality of serially connected inverters configured to receive the timing signal for generating the negative voltage and output the first signal to the first inverter.

* * * * *